United States Patent [19]

Shubat et al.

[11] Patent Number: 4,961,172

[45] Date of Patent: Oct. 2, 1990

[54] DECODER FOR A MEMORY ADDRESS BUS

[75] Inventors: Alexander Shubat, Newark; Yoram Cedar, Sunnyvale, both of Calif.

[73] Assignee: WaferScale Integration, Inc., Fremont, Calif.

[21] Appl. No.: 231,122

[22] Filed: Aug. 11, 1988

[51] Int. Cl.[5] .............................................. G11C 7/00
[52] U.S. Cl. ........................... 365/230.06; 365/230.03; 365/189.02; 365/233.5
[58] Field of Search ...................... 365/230.02, 230.03, 365/230.06, 230.08, 233, 233.5, 189.03, 194, 195, 189.02

[56] References Cited

U.S. PATENT DOCUMENTS

| | | | |
|---|---|---|---|
| 4,338,679 | 7/1982 | O'Toole | 365/233 X |
| 4,479,180 | 10/1984 | Miller et al. | 364/200 |
| 4,495,603 | 1/1985 | Varshney | 365/233 |
| 4,566,082 | 1/1986 | Anderson | 365/230.03 |
| 4,612,631 | 9/1986 | Ochii | 365/203 |
| 4,616,342 | 10/1986 | Miyamoto | 365/233.5 |
| 4,633,429 | 12/1986 | Lewandowski et al. | 365/230.06 |
| 4,689,771 | 8/1987 | Wang et al. | 365/189 |
| 4,719,602 | 1/1988 | Hag et al. | 365/230 |

OTHER PUBLICATIONS

"1 Megabit (64×16 Bit) & 512K (32K×16-Bit) CMOS Static RAM Plastic SIP Module", Integrated Device Technology Inc., Dec. 1987, pp. 13-74 thru 13-79.

"HPL-82C339", Harris, pp. 6-20 thru 6-39, (publication date not available).

"PAL/PLE Device Programmable Logic Array Handbook", Monolithic Memories Inc., Handbook, Fifth Edition 1986, pp. 10-1 thru 10-9.

L. Canals, "RAM/EPROM Storage Module for the ZX81 (Microcomputer)", Rev. Esp. Electron., Nov. 1984, vol. 31, No. 360, p. 52-5.

David G. Williams, "ASICs Optimize Chip-Select Decoding Functions", EDN, Oct. 2, 1986, pp. 195-198, p. 200.

Donald E. Smith, et al., "Regain Lost I/O Ports With Erasable PLDs", Electronic Design, Mar. 19, 1987, pp. 151-154, p. 156.

*Primary Examiner*—Joseph A. Popek
*Attorney, Agent, or Firm*—Skjerven, Morrill, MacPherson, Franklin & Friel

[57] ABSTRACT

A circuit constructed in accordance with my invention includes a microprocessor for generating addresses on an address bus, a plurality of memory devices, and a decoder for decoding the address on the address bus and generating select signals in response thereto. Of importance, the memory devices are also coupled to the address bus. A memory enable circuit is provided for enabling the memory devices before the decoder generates the select signals. Thus, the time required by the decoder to decode address signals does not add to the delay between the time an address is asserted by the microprocessor and the time one of the memory devices responds by providing data. In one embodiment, the memory enable circuit is incorporated into the bit line decoder of the memory devices. Thus, if one of the bit lines of the plurality of memory devices is selected to provide data, the memory device is enabled. Since the word line decoder is generally slower than the bit line decoder, inclusion of the memory enable circuit into the bit line decoder will not slow the memory devices. Also in one embodiment, the bit line decoder is programmable so that the memory devices can be mapped into different blocks of addresses within the microprocessor address space.

15 Claims, 9 Drawing Sheets

Fig. 2a ADDRESS

Fig. 2d $\overline{OE}$

Fig. 2e DATA (Prior Art)

| FIG. 7a |
| FIG. 7b |

FIGURE 7b

DECODER FOR A MEMORY ADDRESS BUS

BACKGROUND OF THE INVENTION

1. Field of the Invention

This invention relates to semiconductor memory devices, circuits for decoding address busses for memory devices, and circuits for selecting one of a plurality of memory devices in response to addresses provided on an address bus.

2. Description of the Prior Art

Typical microprocessor systems include a microprocessor having an address bus which defines a memory address space. The address bus is coupled to a plurality of memory devices such as EPROMs and static RAMs and an address bus decoder. The address bus decoder generates a plurality of chip select signals for selecting one of the memory devices, thereby mapping the memory devices into selected blocks of addresses within the memory address space. Unfortunately, as described below, the address decoder adds to the delay between the time an address is provided on the address bus and the time data is provided by the memory devices because the memory devices cannot begin read operations until they are selected by the decoder.

Figure 1:
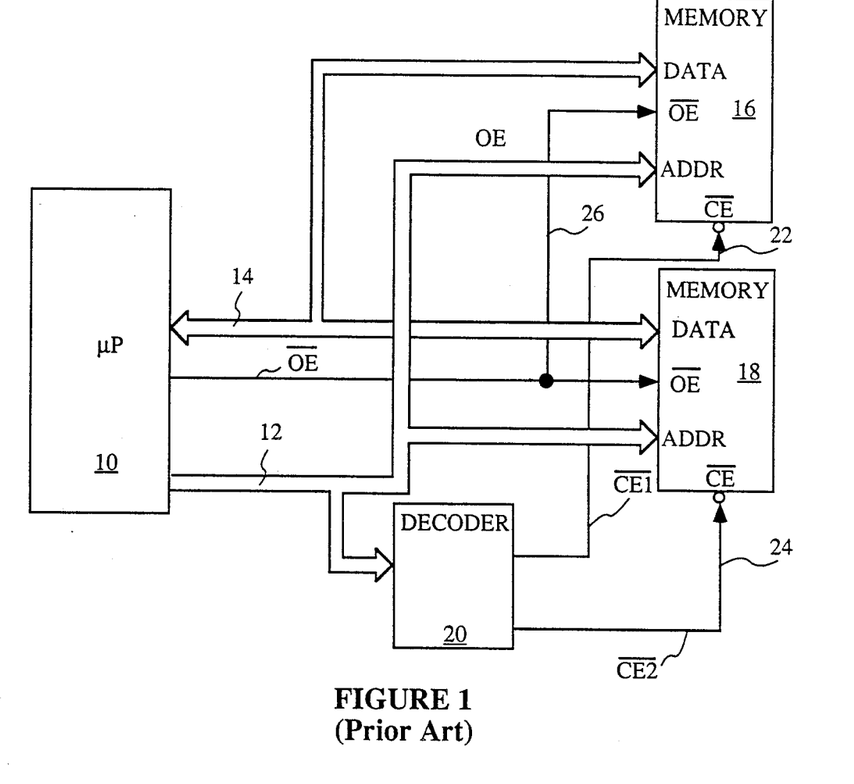
FIG. 1 illustrates a microprocessor system constructed in accordance with the prior art.
Figure 1A:
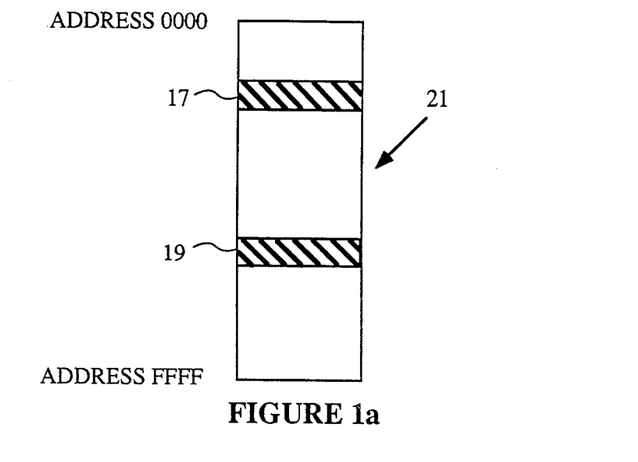
FIG. 1a is a memory map of microprocessor 10 of FIG. 1.

FIG. 1 illustrates a typical prior art microprocessor system which includes a microprocessor 10 having an address bus 12 and a bidirectional data bus 14 used to facilitate the transfer of data between microprocessor 10 and memory devices 16 and 18. Memory devices 16 and 18 are typically static RAMs, EPROMs, EEPROMs, or other conventional memory devices. A decoder 20 maps the address space of memory devices 16 and 18 into the memory address space defined by address bus 12. Thus, FIG. 1a illustrates the memory address space 21 defined by address bus 12. In the illustrated circuit, memory device 16 is a 2k word memory device mapped into address block 17, while memory device 18 is a 2k word memory device mapped into address block 19.

The circuit of FIG. 1 is typical of systems in which device 16 is one type of memory device (e.g. an EPROM) and device 18 is another type of memory device (e.g. static RAM). The circuit of FIG. 1 is also typical of systems in which devices 16 and 18 are the same type of memory device (e.g. EPROMs) because if one desired to have two noncontiguous address blocks of EPROM memory in address space 21, this typically requires two EPROMs and a decoder.

Of importance, when microprocessor 10 accesses a location in one of memory devices 16 and 18, an address is placed on address bus 12, and the address is decoded by decoder 20 which determines whether the address corresponds to a location within memory device 16 (i.e. an address within address block 17), a location within memory device 18 (i.e. an address within address block 19), or an address location within a device (not shown) other than devices 16 or 18. If the address to be accessed by microprocessor 10 corresponds to a location within memory device 16, decoder 20 provides a signal $\overline{CE1}$ on an enable line 22 to thereby enable memory device 16. Conversely, if the address accessed by microprocessor 10 corresponds to a location within memory device 18, decoder 20 provides a signal $\overline{CE2}$ on an enable line 24 to thereby enable memory device 18. Signals $\overline{CE1}$ and $\overline{CE2}$ cause devices 16 and 18 to power up their respective sense amplifiers (not shown). If devices 16 and 18 are EPROMs or EEPROMs, signals $\overline{CE1}$ and $\overline{CE2}$ also cause devices 16 and 18 to ground the memory cell source regions. For the case of a static RAM, signals $\overline{CE1}$ and $\overline{CE2}$ are also logically ANDed with a write enable signal generated by microprocessor 10 (not shown). Thus, for example, if device 16 is a static RAM, write operations cannot be performed by device 16 unless both the $\overline{CE1}$ signal and the write enable signal are active.

Address bus 12 is also coupled directly to memory devices 16 and 18 to select individual locations within memory devices 16 and 18. In some prior art memory devices, signals $\overline{CE1}$ and $\overline{CE2}$ also enable the memory device address input buffers.

When microprocessor 10 reads data from memory device 16 or 18, an output enable signal $\overline{OE}$ is asserted on an enable line 26 by microprocessor 10, which causes the selected memory device to drive data bus 14 with appropriate data. (Signal $\overline{OE}$ is used to control whether the data output buffers of devices 16 and 18 are three-stated, but is logically ANDed with signal $\overline{CS1}$ by an AND gate within device 16 and with signal $\overline{CS2}$ by an AND gate within device 18 so that devices 16 and 18 can only drive data bus 14 when they are selected.)

Although FIG. 1 illustrates only two devices coupled to microprocessor 10, microprocessor systems typically include other memory devices, including EPROMs, ROMs, static RAMs, or peripheral devices such as I/0 devices.

Figure 2A:
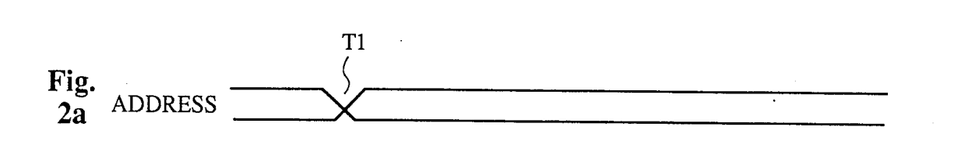
FIGS. 2a to 2e illustrate various waveforms provided by the system of FIG. 1.
Figure 2B:
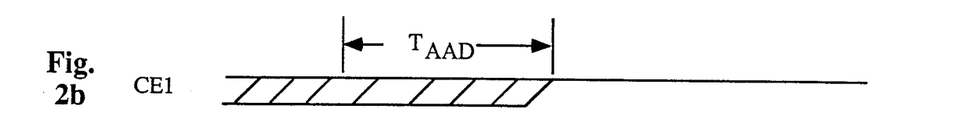
Figure 2C:
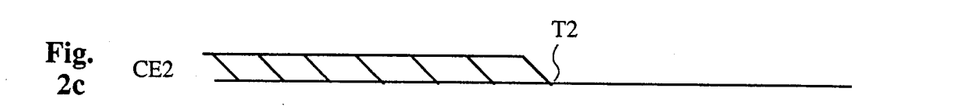
Figure 2D:
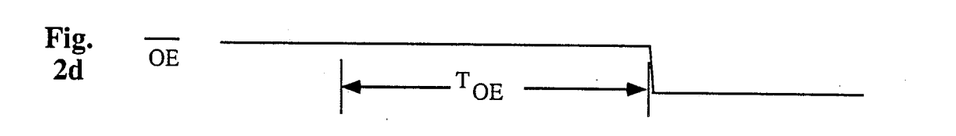
Figure 2E:
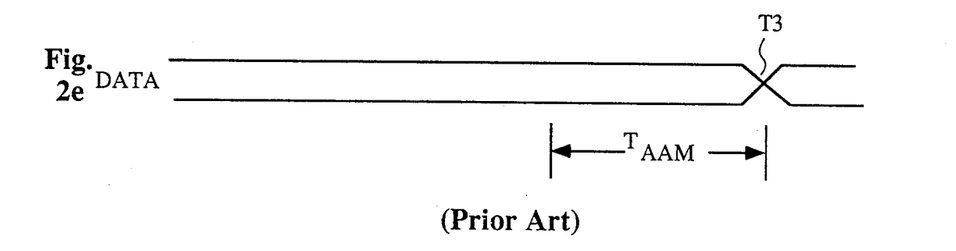

FIGS. 2a to 2e illustrate the timing of the various signals generated in FIG. 1. Referring to FIG. 2a, at time T1, microprocessor 10 drives address bus 12 with an address corresponding to a location within memory device 18. Thereafter, decoder 20 recognizes the address on address bus 12 as corresponding to a location within memory device 18 and at time T2, causes signal $\overline{CE2}$ on output line 24 to go active (low) and ensures that signal $\overline{CE1}$ on line 22 is inactive (high). Time delay $T_{AAD}$ represents the propagation delay between the time an address is received by decoder 20 and the time decoder 20 asserts (i.e. holds active) either signal $\overline{CE1}$ or signal $\overline{CE2}$. A predetermined time period ($T_{OE}$) after microprocessor 10 asserts the address on address bus 12, microprocessor 10 then asserts output enable signal $\overline{OE}$ on line 26. Thereafter, at time T3, memory device 18 provides data on data bus 14. Of importance, memory device 18 exhibits a propagation delay $T_{AAM}$ between the time signal $\overline{CE2}$ is asserted and the time memory device 18 provides data on data bus 14.

The total time delay between the time an address is asserted on address bus 72 and the time memory device 18 provides appropriate data equals $T_{AAD}$ plus $T_{AAM}$. It would be desirable to eliminate or reduce this time delay to enhance the speed of the microprocessor system.

SUMMARY

A microprocessor system constructed in accordance with my invention includes means for selecting a plurality of memory devices at the start of each addressing cycle. Each memory device receives an address and begins reading the data stored at that address before a decoder selects which individual memory device is to be enabled. Therefore, the time delay inherent in the decoder does not delay the response time of the memory devices. Of importance, the decoder maps the memory devices into the address space of the microprocessor system address bus.

In another embodiment of my invention, a memory device is provided which includes a plurality of bit lines which are selectively coupled to an output buffer by a multiplexer. The multiplexer is controlled by a bit line decoder which in turn is controlled by addresses received from an address bus. The bit line decoder contains programmable logic such that different groups of bit lines can be mapped into different blocks of address locations within the address space defined by the address bus. Thus, a single memory integrated circuit in accordance with this embodiment is constructed so that different groups of memory cells can be selectively mapped into different blocks of addresses. In accordance with one novel feature of this embodiment, the memory device is enabled in response to one or more of the address signals on the address bus changing state, so that read operations do not have to wait for an external address decoder to decode the address signals and provide a chip select signal.

These and other advantages of the present invention will be better understood with reference to the drawings and detailed description below.

BRIEF DESCRIPTION OF THE DRAWINGS

FIG. 7 illustrates the manner in which FIGS. 7a and 7b are to be placed relative to one another.

DETAILED DESCRIPTION

A microprocessor system includes a decoder for decoding addresses on an address bus and selecting one of a plurality of memory devices in response thereto. As described below, the presence of the decoder does not add to the propagation delay between the time an address appears on the address bus and the time one of the memory devices responds with data.

Figure 3:
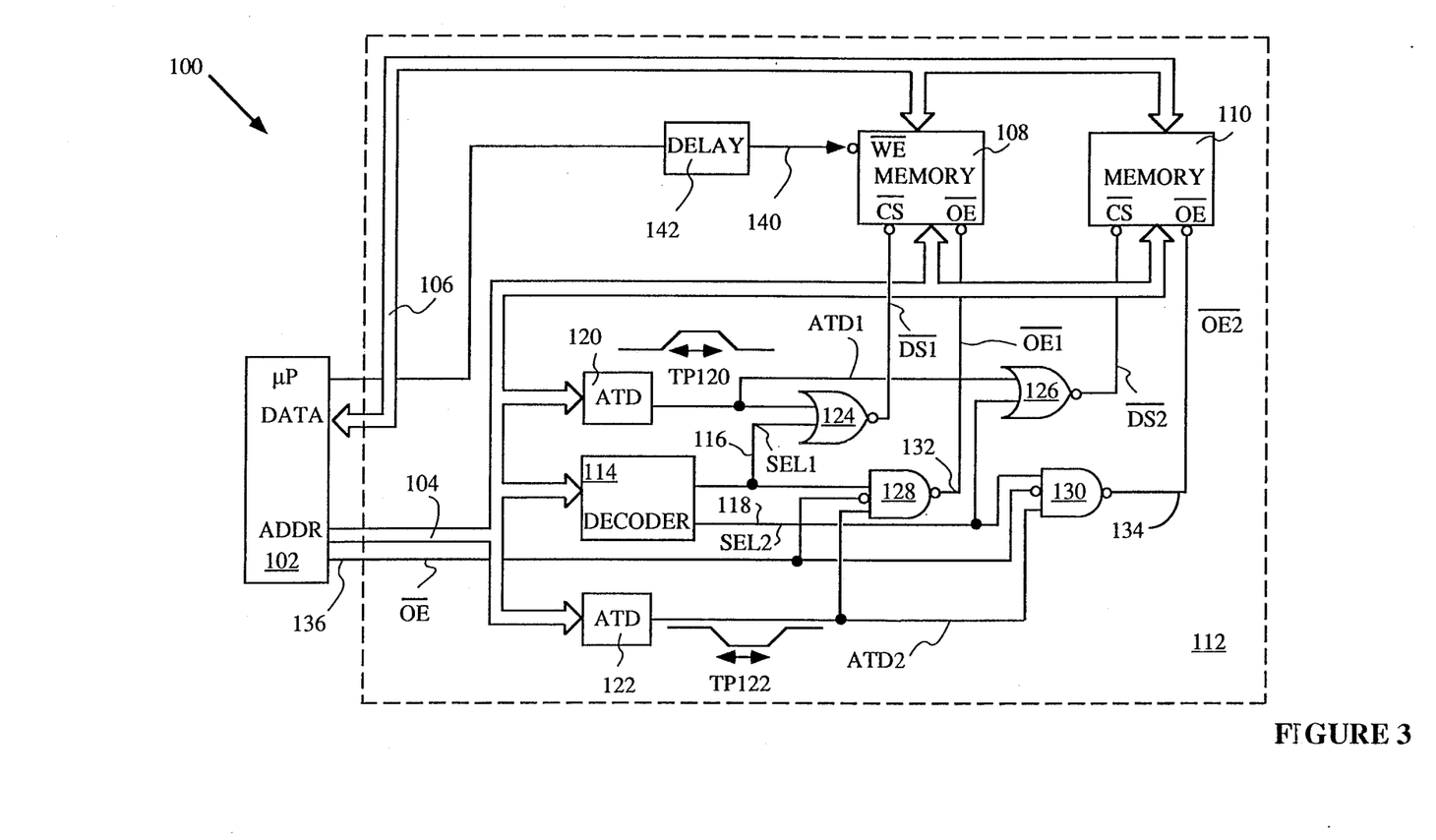
FIG. 3 illustrates a microprocessor system constructed in accordance with one embodiment of my invention.

FIG. 3 is a block diagram of a microprocessor system 100 constructed in accordance with my invention. Referring to FIG. 3, a microprocessor 102 includes an address bus 104 and a data bus 106 for communicating with memory devices 108 and 110, respectively. In one embodiment, memory device 108 is a static RAM and memory device 110 is an EPROM, both formed within the same integrated circuit 112. However, in an alternative embodiment, memory devices 108 and 110 are separate integrated circuits. Address bus 104 is coupled to memory devices 108 and 110 and a decoder 114. Of importance, decoder 114 provides signals SEL1 and SEL2 on output lines 116 and 118 for selecting memory devices 108 and 110, respectively. However, in accordance with one novel feature of my invention, decoder 114 does not add to the time delay between the time an address is provided on address bus 104 and the time memory device 108 or 110 provides data on data bus 106. The reason for this is as follows.

Address bus 104 is also coupled to ATD circuits 120 and 122. Of importance, the output signal ATD1 of ATD circuit 120 is typically low but if any of the address signals on address bus 104 changes state, output signal ATD1 goes high for a time period TP120 (see FIGS. 4a and 4b) and then goes low. The output signal from ATD circuit 120 is presented to NOR gates 124 and 126 which drive the device select input leads of memory devices 108 and 110, respectively. Thus, as soon as the address on bus 104 changes, the output signal from ATD circuit 120 goes high, the output signals $\overline{DS1}$ and $\overline{DS2}$ from NOR gates 124 and 126 go low, and memory devices 108 and 110 are both selected, thereby permitting memory devices 108 and 110 to begin reading operations. (Memory devices 108, 110 respond to signals $\overline{DS1}$ and $\overline{DS2}$ in the same way that devices 16 and 18 respond to signals $\overline{CS1}$ and $\overline{CS2}$. In a preferred embodiment of my invention, however, the address buffers in integrated circuit 112 are always enabled are not enabled in response to signals $\overline{DS1}$ and $\overline{DS2}$.) Thus, memory devices 108 and 110 do not have to wait for output signals from decoder 114 before they begin reading operations.

After propagation delay period $T_{AAD}$, decoder 114 completes decoding the address on address bus 104 and asserts an active high select signal SEL1 on a select line 116 if memory device 108 is to be selected, and asserts an active high select signal SEL2 on a select line 118 if memory device 110 is to be selected. Thus, for example, if memory device 108 is to be selected, signal SEL1 goes high. If signal SEL1 goes high, device select signal $\overline{DS1}$ from NOR gate 124 will remain low, even after output signal ATD1 from ATD circuit 120 goes low. Thus, memory device 108 will be selected as soon as the address signal on bus 104 changes state and will remain selected because signal SEL1 is asserted. Memory device 110 is selected in a similar manner.

Also illustrated in FIG. 3 are NAND gates 128 and 130 for providing active low output enable signals $\overline{OE1}$ and $\overline{OE2}$ on output enable leads 132 and 134, respectively. Of importance, NAND gates 128 and 130 receive signals SEL1 and SEL2, respectively, so that output enable signals $\overline{OE1}$ and $\overline{OE2}$ cannot go active unless memory device 108 is selected or memory device 110 is selected, respectively.

Figure 4A:
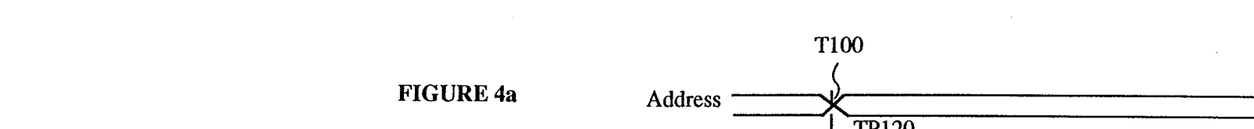
FIGS. 4a to 4i illustrate various waveforms provided by the microprocessor system of FIG. 3.
Figures 4B, 4C:
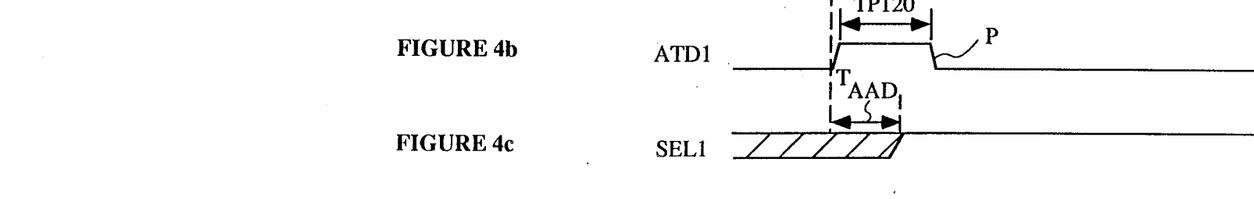
Figure 4D:
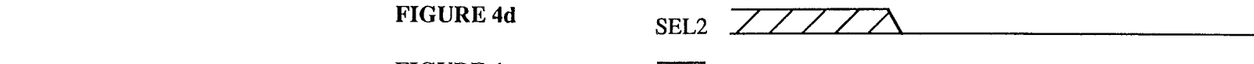
Figure 4E:
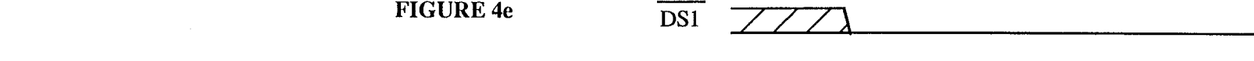
Figure 4F:
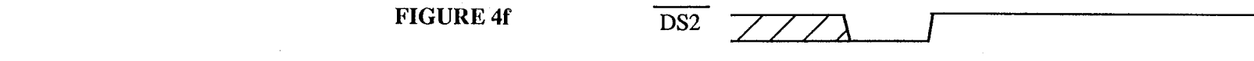
Figure 4G:
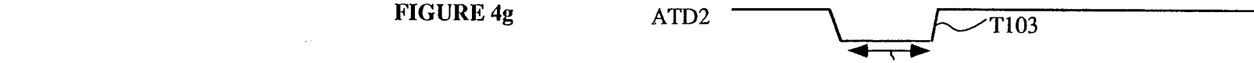
Figure 4H:
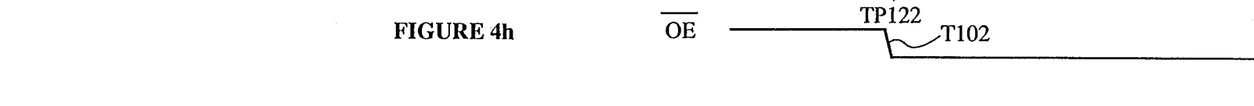
Figure 4I:
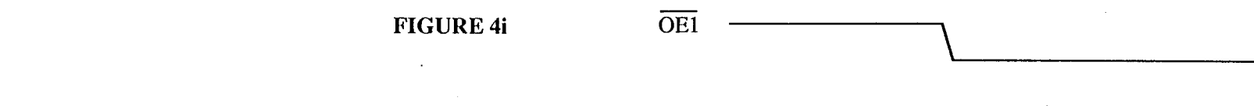

As mentioned above, circuit 112 includes ATD circuit 122, the output signal of which is typically high, but goes low when one of the address signals on address bus 104 changes state, remains low for a time period TP122, and then goes high (FIG. 4g). Of importance, the output signal from ATD circuit 122 is provided on input leads of NAND gates 128 and 130, respectively. Accordingly, ATD circuit 122 prevents either the output enable signal for memory device 108 or 110 from going active until predetermined time period TP122 after the address on address bus 104 changes. This is done to ensure that output enable signals $\overline{OE1}$ and $\overline{OE2}$ are not asserted until it is certain that the output signals from decoder 114 have stabilized.

NAND gates 128 and 130 each include an inverting input lead coupled to an output enable line 136 driven by microprocessor 102. Output enable line 136 is optional and is provided so that microprocessor 102 can prevent memory device 108 and 110 from asserting data on data bus 106 except during selected time periods.

Figure 5:
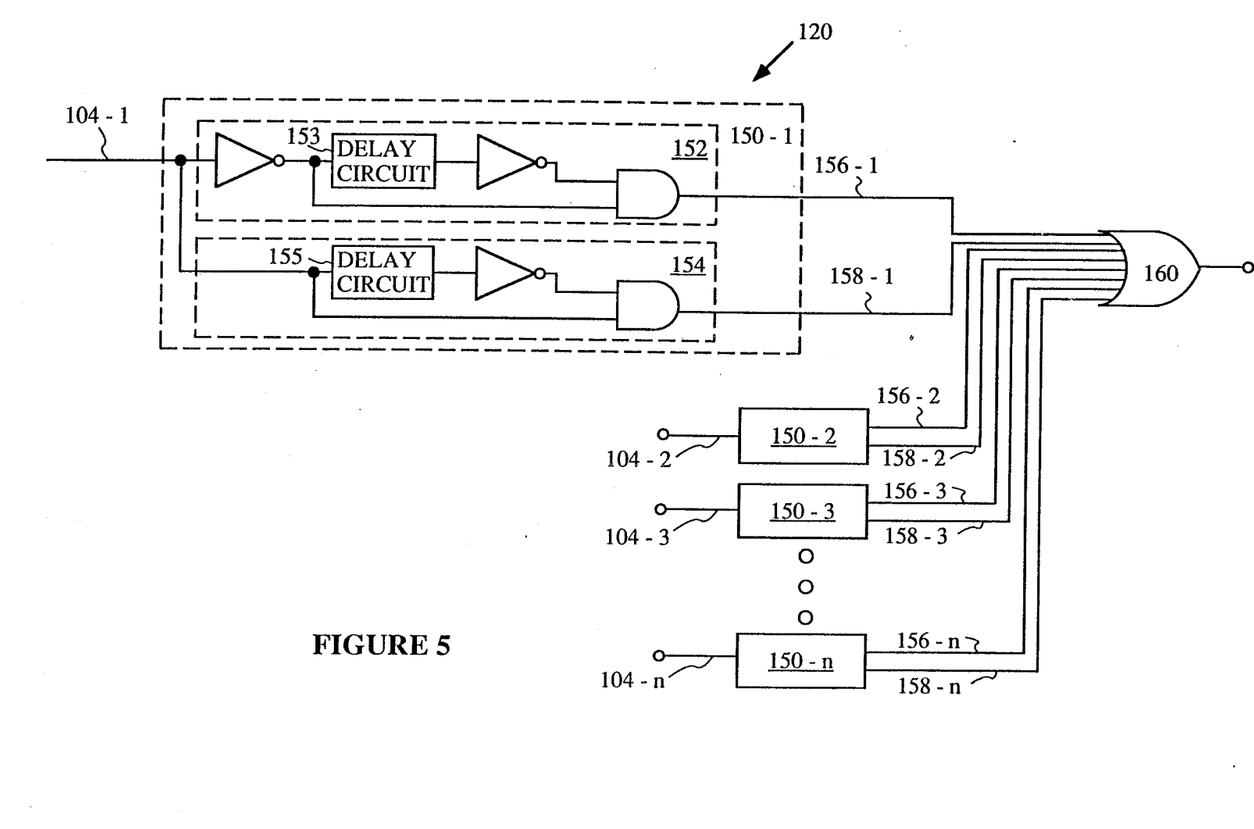
FIG. 5 illustrates an address transition detect (ATD) circuit 120 used in conjunction with my invention.

FIG. 5 schematically illustrates ATD circuit 120. Referring to FIG. 5, each of the address bus lines 104-1 to 104-n of address bus 104 is coupled to an associated circuit 150-to 150-n, each circuit including a first branch such as branch 152, and a second branch such as branch 154. Branches 152 and 154 include delay circuit 153 and 155, respectively. When the address signal on address line 104-l goes from low state to a high state, the output signal from branch 152 goes high for a time period equal to the time delay provided by delay circuit 153 and then goes low, and when the address signal on address line 104-l goes from a high state to a low state, the output signal from branch 154 goes high for a time period equal to the time delay provided by delay circuit 155 and then goes low. Output lines 156-l to 156-n from the first branches and output lines 158-l to 158-n from the second branches are coupled to an OR gate 160. The output signal of OR gate 160 is usually low, but if any of the address signals on address bus 104 changes, the output signal from OR gate 160 will go high for a time period corresponding to the delay provided by the delay lines within circuits 150-l to 150-n and then go low.

ATD circuit 122 is similar to ATD circuit 120 but instead of including an OR gate such as gate 160, a NOR gate is coupled to the various branch output leads.

FIGS. 4a to 4i illustrate the various waveforms provided by system 100. Referring to FIG. 4a, at a time T100, the address on address bus 104 changes. Almost immediately (e.g. about 5 ns) thereafter, ATD circuit 120 provides a positive pulse P which causes the device select signals $\overline{DS1}$ and $\overline{DS2}$ to be asserted (FIGS. 4e and 4f). Therefore, memory devices 108 and 110 immediately begin read operations. (Although ATD circuit 120 takes about 5 ns to respond to address changes, memory devices 108 and 110 commence decoding the address on address bus 104 during that 5 ns time period. Thus, the 5 ns delay of circuit 120 does not add to the delay of memory devices 108 and 110.)

After a time period $T_{AAD}$ decoder 114 completes decoding the address on address bus 104 and causes signal SEL1 to go high and signal SEL2 to go low. Because of this, device select signal $\overline{DS1}$ will remain active (low) even after signal ATD1 goes low. However, signal $\overline{DS2}$ goes inactive (high) after signal ATD1 goes low.

At a time T102, microprocessor 102 asserts an output enable signal $\overline{OE}$ on line 136. However, at time T102, signal ATD2 is still low and thus prevents NAND gates 128 and 130 from asserting signal $\overline{OE1}$ or $\overline{OE2}$. At time period T103, output signal ATD2 from ATD circuit 122 goes high. Because of this, at time T103, all the input signals of NAND gate 128 are active, and therefore output enable signal $\overline{OE1}$ goes low and memory device 108 drives data bus 106 with data.

As is apparent in light of the above description, decoder 114 decodes simultaneously with enablement of read operations of memory devices 108 and 110. Therefore, system 100 can provide data on data bus 106 more rapidly than prior art microprocessor systems. Of importance, the address decoding performed by memory devices 108 and 110 is typically slower than the decoding performed by decoder 114. Therefore, the presence of decoder 114 adds no additional delay between the time an address is presented on bus 104 and the time data is provided on data bus 106. As mentioned above, there is an inherent delay between the time the address on bus 104 changes and the time ATD circuit 120 responds by causing signal ATD1 to go high. However, this time delay is not part of the time-critical signal propagation path of system 100. Specifically, because memory devices 108 and 110 decode the address on address bus 104 during the time delay period inherent in ATD circuit 120, ATD circuit 120 does not add to the response time of memory devices 108 and 110.

One feature of the circuit of FIG. 3 is that the static power consumption of the circuit is equal to the static power consumption of the circuit of FIG. 1 because only one of memory devices 108, 110 is enabled in the steady state. However, the dynamic power consumption of the circuit of FIG. 3 is greater than that of the circuit of FIG. 1 because when the address on lines 104 changes, devices 108, and 110 are simultaneously selected. However, this increase is dynamic power consumption is a minimal disadvantage compared with the advantage of reduction of memory response time.

As mentioned above, in one embodiment, memory device 108 is a static RAM. Thus, in the embodiment illustrated in FIG. 3, memory device 108 is coupled to a write enable line 140 which receives a write enable signal from microprocessor 102. A delay circuit 142 which provides a delay greater than or equal to delay $T_{AAD}$ is interposed between microprocessor 102 and memory device 108 to prevent memory device 108 from beginning write operations until a predetermined time period after the write enable signal is asserted by microprocessor 102. This prevents memory device 108 from being written to until decoder 114 has completed decoding the address on address bus 104 and the output signal from ATD circuits 120 and 122 have gone low and high, respectively. Thus, data will not be written into memory device 108 until it is certain that memory device 108 has been selected.

Of importance, write operations are faster than read operations. (This is because read operations generally require sense amplifiers within the memory device to sense small voltage changes on the memory device bit lines, which takes considerable time.) Thus, if time delay $T_{AAD}$ is not excessively slow, the write cycle need not be slower than the read cycle, even with delay circuit 142 present.

It is noted that the delay provided by delay circuit 142 should be long enough so that the internal write enable signal provided by circuit 142 won't go active until decoder 114 has decoded the address on bus 104. The delay provided by circuit 142 should also be fast enough so as to not increase the write cycle time.

Figure 6:
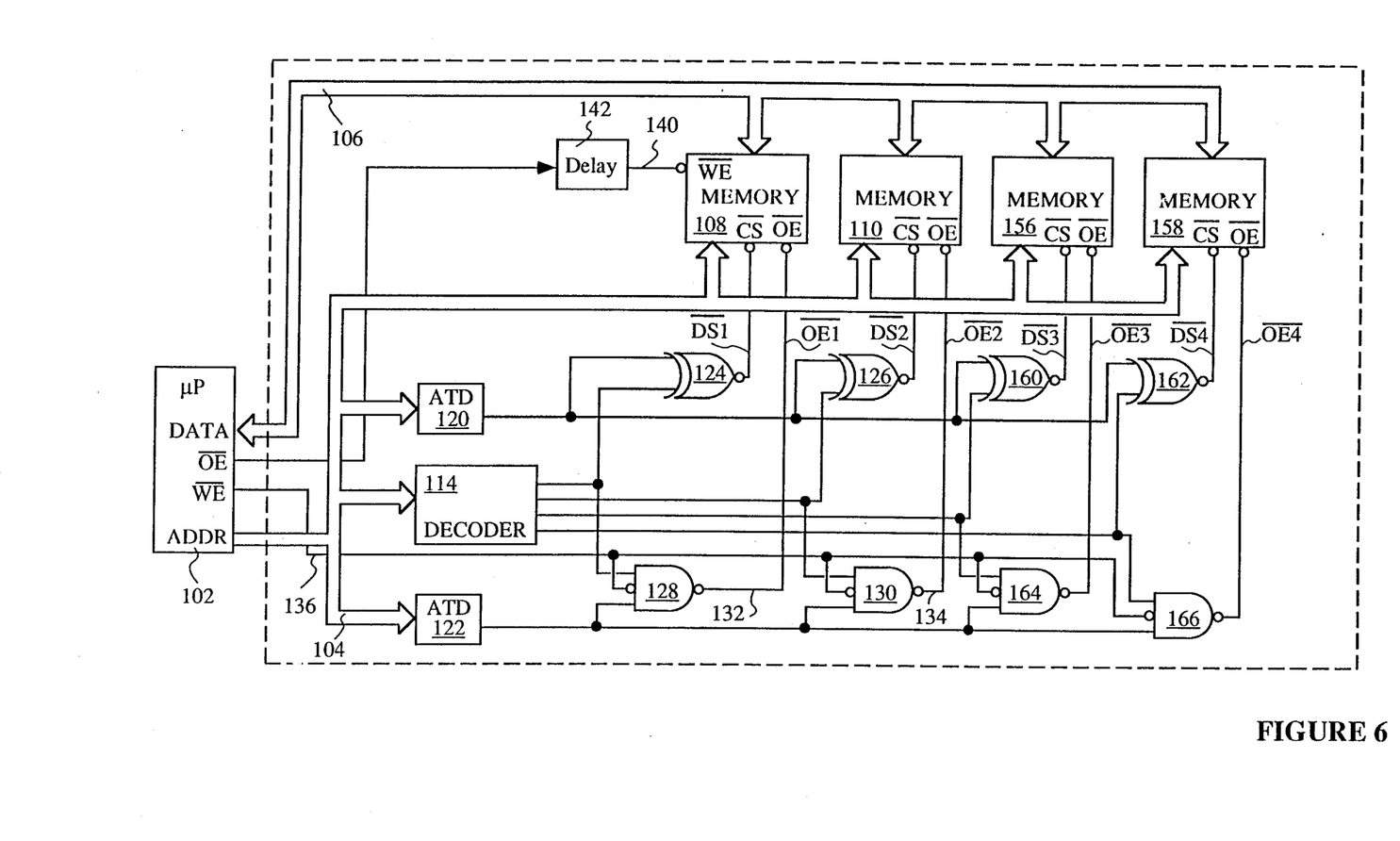
FIG. 6 illustrates a microprocessor system constructed in accordance with another embodiment of my invention.

FIG. 3 illustrates a circuit including only two memory devices. However, in accordance with other embodiments of my invention, more than two devices are provided. For example, FIG. 6 illustrates an embodiment including additional memory devices 156 and 158 which receive device select signal $\overline{DS3}$ and $\overline{DS4}$ from NOR gates 160 and 162, respectively, and which receive output enable signals $\overline{OE3}$ and $\overline{OE4}$ from NAND gates 164 and 166, respectively, in a manner similar to memory devices 108 and 110. In yet other embodiments, more than four memory devices are provided.

In one embodiment of my invention, decoder 114 is a programmable decoder, and includes a programmable logic array which can be either field programmed (e.g., using EPROM cells or fuse programmed elements) or is mask programmed. Thus, decoder 114 can be programmed to map devices 108, 110, 156 and 158 into different blocks of addresses within the address space defined by address bus 104.

Figure 7:
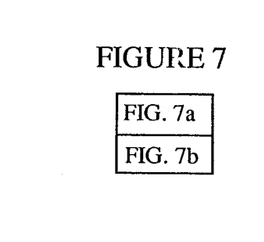
Figure 7A:
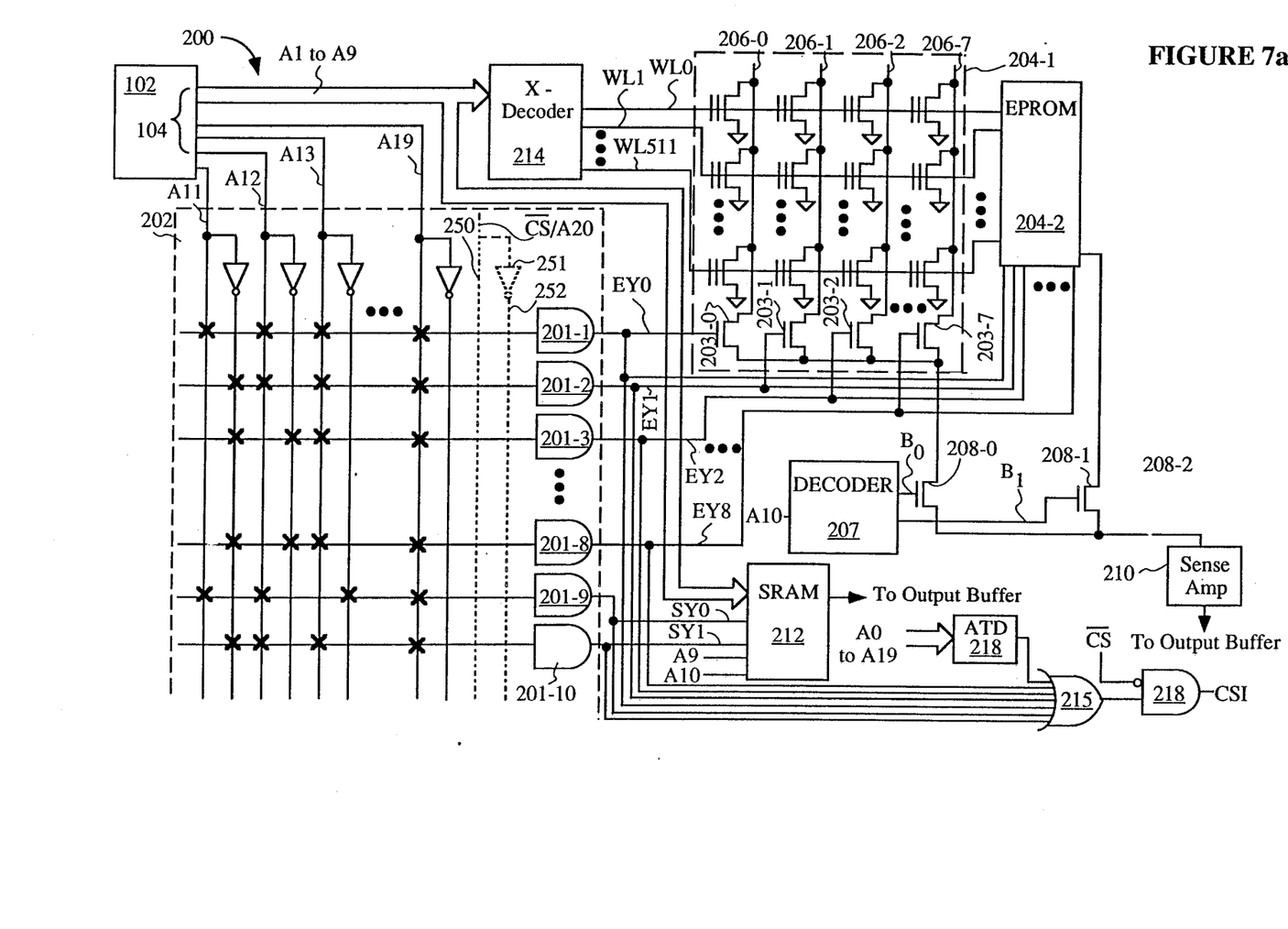
FIGS. 7a and 7b illustrate an alternative embodiment of my invention in which a decoder generates both a chip select signal and serves as part of the Y decoder.
Figure 7B:
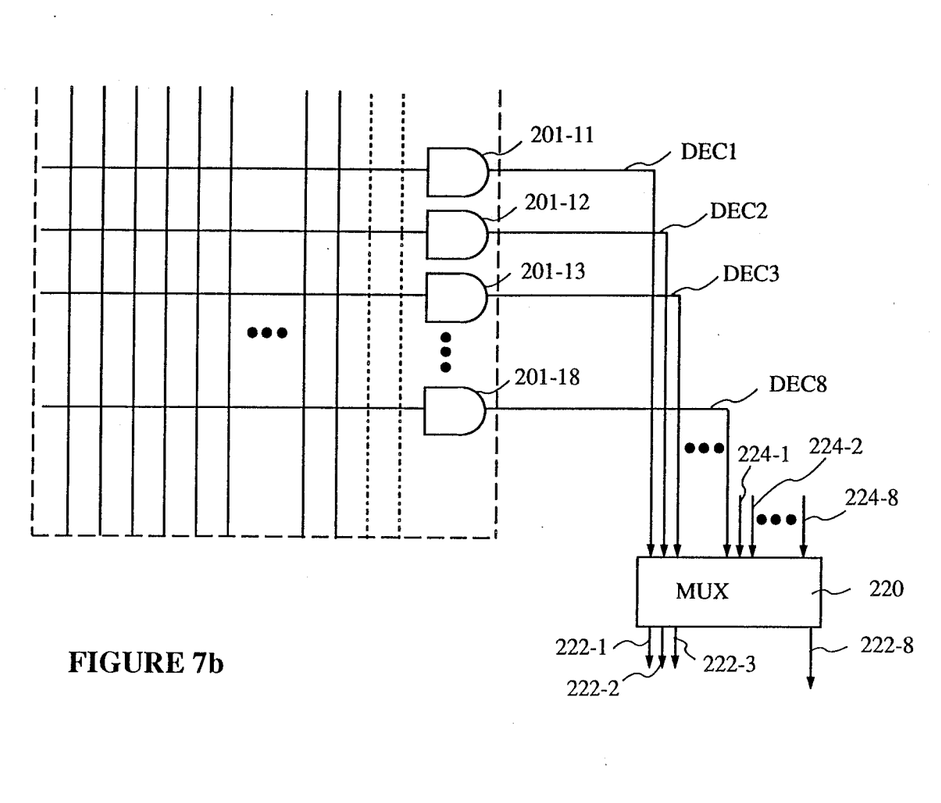

FIGS. 7a and 7b illustrate a memory circuit 200 in accordance with another embodiment of my invention in which address bus 104 is capable of addressing one million words (i.e., address bus 104 includes 20 address lines A0 to A19), and the memory circuit includes 8,000 words of EPROM memory and 2,000 words of static RAM memory. (Each word is typically 16 bits wide, but in other embodiments, other word widths are used.)

The 8,000 words of EPROM memory are divided into eight blocks of 1,000 words and the 2,000 words of static RAM memory are divided into two blocks of 1,000 words. Each EPROM block and each static RAM block can be programmably mapped by a programmable decoder 202 to occupy any 1,000 word address block within the 1,000,000 word address space of the microprocessor. Thus, memory circuit 200 receives address lines corresponding to 1,000,000 words of memory, but contains 10,000 words of memory which can be programmably mapped into any portion of the 1,000,000 word address space.

Of importance, programmable decoder 202 serves as part of the Y decoder of the EPROM and static RAM. Address signals $\overline{A11}$ to $\overline{A19}$ and A11 to A19 are presented on leads programmably electrically coupled to AND gates 201-1 to 201-10 within programmable decoder 202, which generate output signals EY0 to EY7, SY0 and SY1, respectively in response thereto. Signals EY0 to EY7 are used to select the eight 1000-word blocks of EPROM memory. Similarly, signals SY0 and SY1 select the two 1000-word blocks of static RAM memory.

The input leads of AND gates 201-1 to 201-10 can be programmably connected to receive signals A11 to A19 or the logical inverse of signals A11 to A19. In the notation of FIGS. 7a and 7b, AND gate 201-1 is coupled to generate the logical product of a number of signals including signals A11, A12, A13, and A19. Similarly, AND gate 201-2 generates the logical product of a number of signals including signals $\overline{A11}$, A12, A13, and A19.

Signals EY0 to EY7 form part of the Y (bit line) decoder of the EPROM array (the EPROM array comprises portions 204-1 to 204-2). Specifically, signals EY0 to EY7 control pass transistors 203-0 to 203-7, respectively, which in turn control whether bit lines 206-0 to 206-7 are to be coupled to a second pass transistor 208-0. Lines EY0 to EY7 control similar pass transistors in EPROM portion 204-2.

Address signal A10 is coupled to a decoder 207 which generates in response thereto control signals B0 and B1, which in turn control pass transistors 208-0 and 208-1, respectively. Pass transistors 203-0 to 203-7, pass transistors in EPROM portion 204-2 corresponding to pass transistors 203-0 to 203-7, and pass transistors 208-0 and 208-1 constitute the Y decode circuitry of the EPROM and control whether a given bit line is to be coupled to an EPROM sense amplifier 210. (Signals SY0 and SY1 perform a similar function in the static RAM array 212.)

It will be appreciated that the embodiment of FIGS. 7a and 7b does not merely integrate eight EPROMS and a device select decoder onto an integrated circuit. Such a circuit would necessitate duplication of address decode circuitry for each EPROM. Rather, by providing a single EPROM with a single programmable Y decoder, a circuit in accordance with my invention can respond to the addresses in the same manner as a circuit including eight EPROMs, but without requiring duplication of the EPROM X and Y address decoders, sense amplifiers, or peripheral control circuitry.

As mentioned above, circuit 200 stores words that are 16 bits wide. Thus, circuit 200 includes 15 other sense amplifiers and 15 other sets of pass transistors (not shown) for coupling other bit lines to the sense amplifiers.

As can be seen in FIG. 7a, address signals A1 to A9 are decoded by an X decoder 214 which generates therefrom word line signals WL0 to WL511 in a conventional manner. Word line signals WL0 to WL511 are applied to the control gates within EPROM portions 204-1 and 204-2.

It is noted that the X (word line) decoder of a memory circuit is typically slower than the Y decoder. Thus, incorporating decoder 202 into the memory Y decoder will not slow address decoding operations of memory circuit 200. Although it is preferred that decoder 202 be incorporated into the Y decoder, the present invention encompasses an embodiment in which decoder 202 is incorporated into the X decoder.

Signals EY0 to EY7, SY1 and SY2 are also coupled to an OR gate 215, along with an ATD circuit 218 similar to ATD circuit 120. OR gate 215 is coupled to an AND gate 218 which generates an active high chip select signal CSI which serves as a chip select for the entire memory circuit, i.e. to enable both the EPROM and static RAM portions of circuit 200. AND gate 218 includes an inverted input lead which receives a chip select signal $\overline{CS}$ generated by microprocessor 102. This permits microprocessor 102 to disable the memory circuit 200, if desired, even when an address corresponding to EPROM or static RAM address blocks is present on address bus 104.

Figure 8:
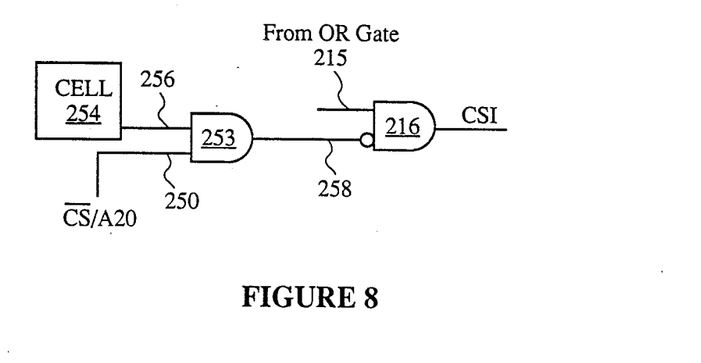
FIG. 8 illustrates circuitry used to programmably control whether an input pin is to serve as a chip select pin or an address input pin.

In another embodiment, the pin on which signal $\overline{CS}$ is received can be programmed to serve as an extra address bus input pin such that memory device 200 is enabled in response to the output signals from ATD circuit 218 and OR gate 215 and not in response to signal $\overline{CS}$. In one such embodiment, a lead 250 receives a signal from the programmable EPROM input pin which serves as either chip select signal $\overline{CS}$ or an address signal A20. Lead 250 is coupled to an AND gate 253 (FIG. 8). A second input lead 256 of AND gate 253 is coupled to a programmable memory cell which controls whether or not the signal on lead 250 is to serve as a chip select signal. When lead 250 is to provide address signal A20, cell 254 drives lead 256 with a low signal. Thus, AND gate 253 drives input lead 258 with a signal that is always low so that signal CSI is independent of the signal on lead 250. Under these circumstances, signal CSI goes active in response to ATD circuit 218 and decoder 202. When lead 250 is to serve as a chip select lead, cell 254 drives AND gate input lead 256 with a high signal, and thus, AND gate 253 merely drives lead 258 with a signal equal to the signal at lead 250. Under these circumstances, internal chip select CSI cannot go active unless the signal at lead 250 is low.

An inverter 251 within decoder 202 (shown in phantom in FIG. 7a) is coupled to lead 250 and drives lead 252. When the signal on lead 250 is to serve as address signal A20, lines 250 and 252 are programmably electrically coupled to AND gates 201-1 to 201-10 in the same manner as the other address lines within decoder 202. When the signal on lead 250 is to serve as chip select signal $\overline{CS}$ and not as address signal A20, leads 250 and 252 are both programmably decoupled from AND gates 201-1 to 201-10, so that the output signals from gates 201-1 to 201-10 are independent of the state of signal $\overline{CS}$.

As mentioned above, decoder 202 can be implemented using mask programming, fuse programming, or floating gate programming. In an embodiment using floating gate programming, decoder 202 can be implemented by using EPROMs such as described in U.S. Pat. No. 4,639,983, issued to Boaz Eitan on Jan. 27, 1987.

The output drivers from memory circuit 200 can be of a conventional design. However, in another embodiment, memory device 200 is coupled to an output driver such as the output driver disclosed in copending application Ser. No. 07/231,123 entitled "OUTPUT CIRCUIT FOR DRIVING A MEMORY DEVICE," filed on the same day as the present application and incorporated herein by reference. The output drivers coupled to the static RAM and EPROM are typically connected to an ATD circuit such as circuit 122 (FIG. 3), which prevents static RAM 212 and the EPROM from simultaneously driving the data output pins with output data.

In one embodiment of my invention, memory circuit 200 can be configured to store 10,000 16-bit words or 20,000 8-bit words. In this embodiment, memory circuit 200 includes sixteen I/0 buffers for communicating with data bus 106. When memory circuit 200 is in the 8-bit word mode, and thus only uses 8 of the I/0 buffers to communicate with data bus 106, the remaining eight I/0 buffers can be used to communicate output signals from programmable decoder 202. Thus, in addition to providing decoder output signals on leads EY0 to EY7, SY0 and SY1, decoder 202 also includes AND gates 201-11 to 201-18 for driving decoder output leads DEC1 to DEC8. Leads DEC1 to DEC8 are coupled to a multiplexer 220 which either drives I/0 pins 222-1 to 222-8 with the signals on leads DEC1 to DEC8 or data signals from lines 224-1 to 224-8 (which in turn are driven by the EPROM or the static RAM within memory circuit 200). When memory circuit 200 is in the 16-bit mode, I/0 pins 222-1 to 222-8 are coupled to data bus 106, and are driven with data stored in the EPROM or static RAM within memory circuit 200, and when memory circuit 200 is in the 8-bit mode, I/0 pins 222-1 to 222-8 are not connected to data bus 106. Instead, pins 222-1 to 222-8 receive signals generated by decoder 202, and can be used to select other memory or peripheral devices (not shown) coupled to microprocessor 102.

While the invention has been described with regard to several specific embodiments, those skilled in the art will recognize that changes can be made in form and detail without departing from the spirit and scope of the invention. For example, in other embodiments, the internal and external chip select signals and output enable signals can be active high or active low. Accordingly, all such changes come within the scope of the present invention.

I claim:

1. A circuit including at least a first memory device, said circuit comprising:
an address bus for receiving addresses, said address bus including a plurality of lines, said first memory device being coupled to at least some of said lines within said address bus;
decoder means for decoding address signals on at least some of said lines within said plurality of lines and for asserting a first select signal in response thereto, said first select signal being used to select said first memory device; and
means for enabling said first memory device before said decoder means asserts said first select signal and
(a) continuing to enable said first memory device if said decoder means thereafter asserts said first select signal, but
(b) disabling said first memory device if said decoder means fails to assert said first select signal after said decoder means has decoded said address signals.

2. Circuit of claim 1 further comprising a second memory device coupled to at least some of said lines within said address bus, said decoder means asserting a second select signal for selecting said second memory device in response to the address on said address bus, said means for enabling enabling said second memory device before said decoder asserts said second select signal.

3. A circuit including at least a first memory device, said circuit comprising:
an address bus for receiving addresses, said address bus including a plurality of lines, said first memory device being coupled to at least some of said lines within said address bus;
decoder means for decoding the signals on at least some of said lines within said plurality of lines and for asserting a first select signal in response thereto, said first select signal being used to select said first memory device;
means for enabling said first memory device before said decoder means asserts said first select signal; and
means for generating a pulse signal after one of the signals on said address bus changes state, said means for enabling being coupled to said means for generating so that said means for enabling causes said first memory device to be enabled in response to said pulse signal.

4. Circuit of claim 3 wherein said means for enabling comprises an OR gate having an input lead receiving said first select signal and a second input lead receiving said pulse signal, the output signal of said OR gate enabling said first memory device.

5. Circuit of claim 4 wherein said decoder means serves as at least part of the bit line decoder of said first memory device.

6. Circuit of claim 3 wherein at least one of said lines within said address bus is programmably configurable to function as either an address line or a master enable line, and wherein said means for enabling cannot enable said first memory device when said one address line functions as a master enable line unless said master enable line receives an active signal.

7. A circuit comprising:
a first memory device;
an address bus for receiving addresses, said address bus including a plurality of lines, said first memory device being coupled to at least some of said lines within said address bus;
a second memory device coupled to at least some of said lines within said address bus;
decoder means for decoding the signals on at least some of said lines within said address bus and for asserting a first select signal in response thereto, said first select signal being used to select said first memory device, said decoder means also asserting a second select signal for selecting said second memory device in response to the address on said address bus;

means for enabling said first memory device before said decoder means asserts said first select signal and for enabling said second memory device before said decoder means asserts said second select signal;

a data bus coupled to said first and second memory devices;

means for receiving an output enable signal; and means for permitting a selected one of said first and second memory devices to drive said data bus with data in response to a condition in which the signal on said output enable lead is active and said one memory device is selected by said decoder means.

8. Circuit of claim 7 wherein said means for permitting prevents said first and second memory devices from driving said data bus during a predetermined time period following a signal transition on said address bus.

9. A circuit comprising:

first memory means for storing data;

second memory means for storing data;

a programmable memory cell for storing at least one data bit;

a set of address leads for receiving address signals;

means for selecting a location within said first and second memory means in response to at least some of said address signals;

decode means for enabling said first and second memory means in response to at least some of said address signals; and wherein at least one of said address leads is programmably configurable so that said one address lead serves as a master device select input lead or as an address lead depending on the data bit stored in said programmable memory cell, wherein when said one address lead serves as a master device select input lead, said first and second memory means can only be enabled when said one address lead receives an active signal.

10. Circuit comprising:

memory means containing a plurality of blocks of locations for storing data, said memory means being configurable to provide either words of data having an n bit width or an m bit width, where n and m are integers, and m is greater than n;

an address bus for receiving an address;

decode means for providing decoder output signals in response to said received address, at least one of said decoder output signals being used to select at least one of said blocks of locations; and m output lines, said m output lines being programmably configurable to provide m bits of data from said memory means when said memory means is configured to provide words of an m bit width;

means for connecting at least one of said output lines to provide one of said decoder output signals when said memory means is configured to provide words of an n bit width.

11. A memory circuit comprising:

a plurality of columns of memory cells, each column of memory cells being coupled to an associated bit line;

multiplexer means for selectively coupling one of said bit lines to an output pin;

an address bus for receiving address signals, said address bus defining a memory address space; and programmable decode means for controlling said multiplexer means in response to said received address signals to thereby programmably map individual bit lines or groups of bit lines into the memory address space defined by said address bus.

12. Circuit of claim 11 wherein the number of locations in said memory circuit is less than the number of addresses in said memory address space.

13. Circuit of claim 11 wherein said multiplexer means selectively couples one of said bit lines to a sense amplifier in response to said programmable decode means so that said one bit line may be programmably mapped into the memory address space defined by said address bus.

14. A memory circuit comprising:

a plurality of rows of memory cells, each row of memory cells being coupled to an associated word line;

an address bus for receiving address signals, said address bus defining a memory address space; and programmable decode means for providing signals on said word lines in response to said address signals, to thereby programmably map individual cells or groups of cells into the memory address space defined by said address bus.

15. Circuit of claim 14 wherein the number of locations within said memory circuit is less than the number of addresses in said memory address space.

* * * * *

UNITED STATES PATENT AND TRADEMARK OFFICE
CERTIFICATE OF CORRECTION

PATENT NO.   : 4,961,172
DATED        : October 2, 1990
INVENTOR(S)  : Alexander Shubat and Yoram Cedar It is certified that error appears in the above-identified patent and that said Letters Patent is hereby corrected as shown below:

Column 2, line 51, "72" should read --12--.

Column 5, lines 8, "104-$1$" should read --104-1--.

Column 5, line 10, "150-to 150-$n$" should read --150-1 to 150-$n$--.

Column 5, line 14, "104-$1$" should read --104-1--.

Column 5, line 18, "104-$1$goes" should read --104-1 goes--.

Column 5, line 21, "156-$1$" should read --156-1--.

Column 5, line 22, "158-$1$" should read --158-1--.

Column 5, line 28, "150-$1$" should read --150-1--.

Column 7, line 28, "$\overline{A11}$ to $\overline{A19}$ and A11 to A19" should read --A11 to A19 and $\overline{A11}$ to $\overline{A19}$--.

Column 7, line 48, "to" should read --and--.

UNITED STATES PATENT AND TRADEMARK OFFICE
CERTIFICATE OF CORRECTION

PATENT NO. :  4,961,172

DATED :  October 2, 1990

INVENTOR(S) :  Alexander Shubat and Yoram Cedar

It is certified that error appears in the above-identified patent and that said Letters Patent is hereby corrected as shown below:

```
    Column 9, line 20, after "DEVICE" please insert
--OUTPUT LEAD INCLUDING A THREE-STATE INVERTING BUFFER AND A
TRANSFER GATE COUPLED BETWEEN THE BUFFER INPUT LEAD AND THE
BUFFER OUTPUT LEAD--.
```

Signed and Sealed this

Thirtieth Day of June, 1992

*Attest:*

DOUGLAS B. COMER

*Attesting Officer*    *Acting Commissioner of Patents and Trademarks*